•(12) United States Patent
Herr et al.

(10) Patent No.: US 10,608,044 B1
(45) Date of Patent: Mar. 31, 2020

(54) CAPACITIVELY COUPLED SUPERCONDUCTING INTEGRATED CIRCUITS POWERED USING ALTERNATING CURRENT CLOCK SIGNALS

(71) Applicant: Microsoft Technology Licensing, LLC, Redmond, WA (US)

(72) Inventors: Anna Y. Herr, Ellicott City, MD (US); Quentin P. Herr, Ellicott City, MD (US); Joshua A. Strong, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/241,333

(22) Filed: Jan. 7, 2019

(51) Int. Cl.
*H01L 27/18* (2006.01)
*G06F 1/10* (2006.01)
*H01L 39/22* (2006.01)

(52) U.S. Cl.
CPC ........... *H01L 27/18* (2013.01); *G06F 1/10* (2013.01); *H01L 39/223* (2013.01)

(58) Field of Classification Search
CPC ......... H01L 27/18; H01L 39/223; G06F 1/10; G11C 11/44; H03K 17/92; Y10S 505/832; Y10S 505/864
See application file for complete search history.

(56) References Cited

U.S. PATENT DOCUMENTS

| | | | |
|---|---|---|---|
| 4,092,553 A | 5/1978 | Fang et al. | |
| 4,168,441 A | 9/1979 | McDonald et al. | |
| 6,777,808 B2 | 8/2004 | Herr et al. | |
| 7,253,654 B2 | 8/2007 | Amin | |
| 7,733,253 B2 * | 6/2010 | Kirichenko | H03M 1/0604 341/133 |

(Continued)

FOREIGN PATENT DOCUMENTS

JP     S60199216 A    10/1985

OTHER PUBLICATIONS

Makhlin, et al., "Josephson-Junction Qubits with Controlled Couplings", In Journal of Nature, vol. 398, Mar. 25, 1999, pp. 1-5.

(Continued)

*Primary Examiner* — Jung Kim
(74) *Attorney, Agent, or Firm* — Ranjeev Singh; Singh Law, PLLC

(57) ABSTRACT

Capacitively coupled superconducting integrated circuits powered using alternating current clock signals are described. An example superconducting integrated circuit includes a first clock line coupled via a first capacitor to a first superconducting circuit including a first Josephson junction, where the first capacitor is configured to receive a first clock signal having a first phase and couple a first bias current to the first superconducting circuit. The superconducting integrated circuit further includes a second clock line coupled via a second capacitor to a second superconducting circuit including a second Josephson junction, where the second capacitor is configured to receive a second clock signal having a second phase and couple a second bias current to the second superconducting circuit, and where the second phase is different from the first phase.

20 Claims, 5 Drawing Sheets

(56) References Cited

U.S. PATENT DOCUMENTS

| | | |
|---|---|---|
| 9,174,840 B2 | 11/2015 | Herr et al. |
| 9,503,063 B1 | 11/2016 | Abraham et al. |
| 2018/0013052 A1 | 1/2018 | Oliver et al. |

OTHER PUBLICATIONS

Herr, Quentin, et al., "Ultra-Low-Power Superconductor Logic," In Journal of Applied Physics, vol. 109, Issue 10, May 17, 2011, 7 pages.

* cited by examiner

CAPACITIVELY COUPLED SUPERCONDUCTING INTEGRATED CIRCUITS POWERED USING ALTERNATING CURRENT CLOCK SIGNALS

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits.

SUMMARY

In one example, the present disclosure relates to a superconducting integrated circuit comprising a first clock line coupled via a first capacitor to a first superconducting circuit comprising a first Josephson junction, where the first capacitor is configured to receive a first clock signal having a first phase and couple a first bias current to the first superconducting circuit. The superconducting integrated circuit further comprises a second clock line coupled via a second capacitor to a second superconducting circuit comprising a second Josephson junction, where the second capacitor is configured to receive a second clock signal having a second phase and couple a second bias current to the second superconducting circuit, where the second phase is different from the first phase.

In another aspect, the present disclosure relates to a superconducting integrated circuit comprising a first clock line coupled via a first capacitor to a first superconducting circuit comprising a first Josephson junction, where the first capacitor is configured to receive a first clock signal having a first phase and couple a first bias current to the first superconducting circuit. The superconducting integrated circuit further comprises a second clock line coupled via a second capacitor to a second superconducting circuit comprising a second Josephson junction, where the second capacitor is configured to receive a second clock signal having a second phase and couple a second bias current to the second superconducting circuit. The superconducting integrated circuit further comprises a third clock line coupled via a third capacitor to a third superconducting circuit comprising a third Josephson junction, where the third capacitor is configured to receive a third clock signal having a third phase and couple a third bias current to the third superconducting circuit. The superconducting integrated circuit further comprises a fourth clock line coupled via a fourth capacitor to a fourth superconducting circuit comprising a fourth Josephson junction, where the fourth capacitor is configured to receive a fourth clock signal having a fourth phase and couple a fourth bias current to the fourth superconducting circuit, where each of the first phase, the second phase, the third phase, and the fourth phase is different from each other.

In yet another aspect, the present disclosure relates to a superconducting integrated circuit comprising a first superconducting circuit comprising a first Josephson junction coupled to a first node and a second Josephson junction coupled between the first node and a ground terminal. The superconducting integrated circuit further comprises a second superconducting circuit comprising a third Josephson junction coupled to a second node and a fourth Josephson junction coupled between the second node and the ground terminal. The superconducting integrated circuit further comprises a first clock line coupled via a first capacitor to the first Josephson junction, where the first capacitor is configured to receive a first clock signal having a first phase and couple a first bias current to the first Josephson junction. The superconducting integrated circuit further comprises a second clock line coupled via a second capacitor to the second Josephson junction, where the second capacitor is configured to receive a second clock signal having a second phase and couple a second bias current to the second Josephson junction. The superconducting integrated circuit further comprises a third clock line coupled via a third capacitor to third Josephson junction, where the third capacitor is configured to receive a third clock signal having a third phase and couple a third bias current to the third Josephson junction. The superconducting integrated circuit further comprises a fourth clock line coupled via a fourth capacitor to the fourth Josephson junction, where the fourth capacitor is configured to receive a fourth clock signal having a fourth phase and couple a fourth bias current to the fourth Josephson junction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
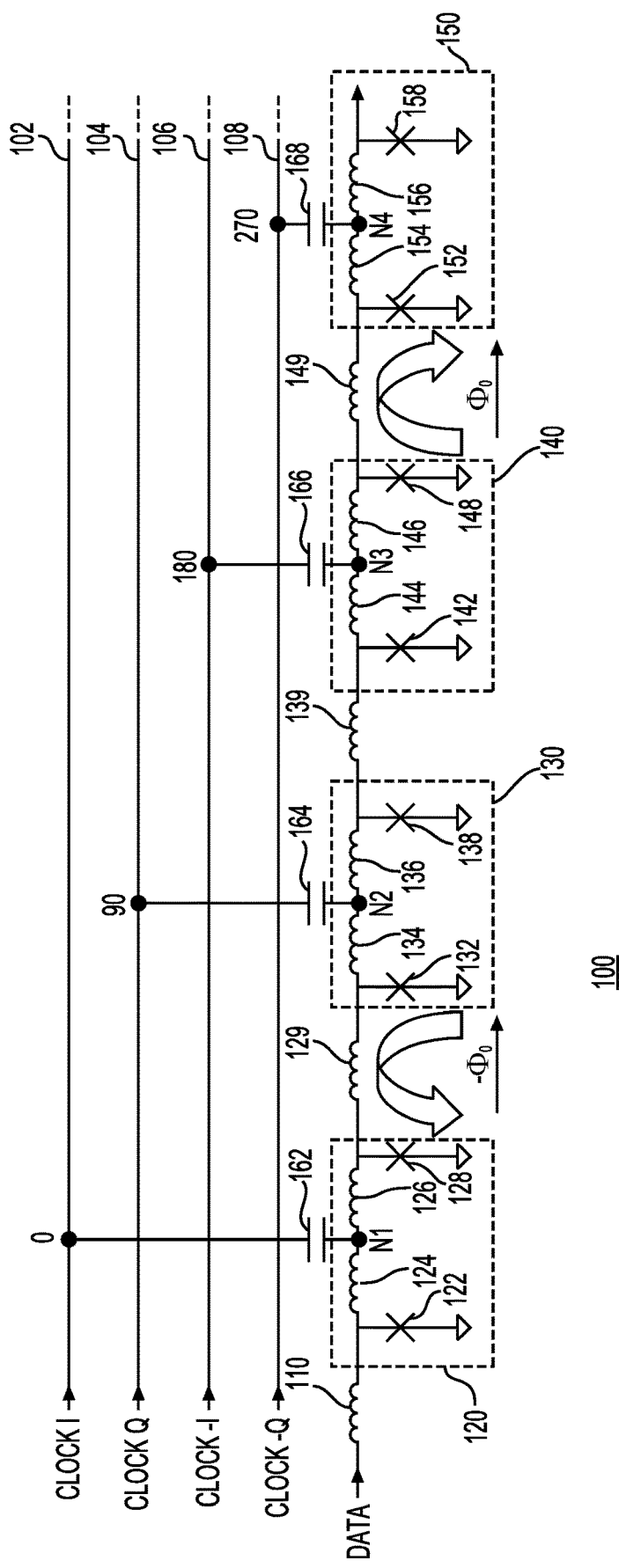
FIG. 1 is a diagram of a superconducting integrated circuit including circuits that are capacitively coupled to clock lines in accordance with one example.

Examples described in this disclosure relate to capacitively coupled superconducting integrated circuits powered using alternating current (AC). Certain examples described in this disclosure relate to reciprocal quantum logic (RQL) circuits that may be implemented using wave pipelined logic or phase-mode logic. Such RQL circuits may act as low-power superconductor logic circuits.

Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Certain examples described in this disclosure relate to the use of capacitors to couple AC power to superconducting circuits including Josephson junctions. The capacitors are selected to have a smaller capacitance compared to the capacitance of a Josephson junction device so as not to load the superconducting circuit. The smaller size of the capacitors relative to transformers that are used for inductively coupling AC power to such superconducting circuits may advantageously allow the technology to scale to smaller feature sizes and larger integrated circuit die. In addition, the use of capacitive coupling to superconducting circuits, such as RQL circuits may further improve these circuits for several reasons. As an example, capacitive coupling may increase the performance of the superconducting circuits because of faster Josephson junction switching. In addition, because capacitors are easier to fabricate than transformers the fabrication complexity may be reduced. Moreover, the elimination of the bias inductors and the associated DC flux bias may further reduce the area required for supplying AC power to the superconducting circuits. Additionally, the use of capacitors in the clock network may result in less dissipation of energy, particularly at high frequencies. Also, as explained later, the use of capacitors to couple AC power may enable full-data rate for phase-mode logic circuits using bipolar bias. Alternatively, an AC clock that is a multiple of the data rate may be used for low-latency phase-mode logic circuits. Finally, the use of capacitive coupling may support a wider range of data encoding schemes, including unipolar single-flux quantum (SFQ) pulses and multiple SFQ pulses per clock cycle.

FIG. 1 is a diagram of a superconducting integrated circuit 100 including circuits that are capacitively coupled to clock lines in accordance with one example. Superconducting integrated circuit 100 may include superconducting circuit 120 coupled via capacitor 162 to clock line 102 coupled to the CLOCK I terminal. Superconducting integrated circuit 100 may further include superconducting circuit 130 coupled via capacitor 164 to clock line 104 coupled to the CLOCK Q terminal. Superconducting integrated circuit 100 may further include superconducting circuit 140 coupled via capacitor 166 to clock line 106 coupled to the CLOCK −I terminal. Superconducting integrated circuit 100 may further include superconducting circuit 150 coupled via capacitor 168 to clock line 108 coupled to the CLOCK −Q terminal. Data input may be received via the DATA terminal that may be coupled to superconducting circuit 120 via an inductor 110. Superconducting circuit 120 may include a Josephson junction (JJ) 122 coupled between one end of inductor 110 and a ground terminal. JJ 122 may further be coupled to inductor 124, which may be coupled to a node N1. The node N1 may be coupled to capacitor 162 and an inductor 126. Another JJ 128 may be coupled between one end of inductor 126 and the ground terminal. Superconducting circuit 120 may be coupled via inductor 129 to superconducting circuit 130. In addition, superconducting circuit 120 may be coupled via capacitor 164 to receive an AC clock signal with a phase of 0 degrees.

With continued reference to FIG. 1, superconducting circuit 130 may include a Josephson junction (JJ) 132 coupled between one end of inductor 129 and the ground terminal. JJ 132 may further be coupled to inductor 134, which may be coupled to a node N2. The node N2 may be coupled to capacitor 164 and an inductor 136. Another JJ 138 may be coupled between one end of inductor 136 and the ground terminal. Superconducting circuit 130 may be coupled via inductor 139 to superconducting circuit 140. In addition, superconducting circuit 130 may be coupled via capacitor 166 to receive an AC clock signal with a phase of 90 degrees.

Still referring to FIG. 1, superconducting circuit 140 may include a Josephson junction (JJ) 142 coupled between one end of inductor 139 and the ground terminal. JJ 142 may further be coupled to inductor 144, which may be coupled to a node N3. The node N3 may be coupled to capacitor 166 and an inductor 146. Another JJ 148 may be coupled between one end of inductor 146 and the ground terminal. Superconducting circuit 140 may be coupled via inductor 149 to superconducting circuit 150. In addition, superconducting circuit 140 may be coupled via capacitor 166 to receive an AC clock signal with a phase of 180 degrees.

With continued reference to FIG. 1, superconducting circuit 150 may include a Josephson junction (JJ) 152 coupled between one end of inductor 149 and the ground terminal. JJ 152 may further be coupled to inductor 154, which may be coupled to a node N4. The node N4 may be coupled to capacitor 168 and an inductor 156. Another JJ 158 may be coupled between one end of inductor 156 and the ground terminal. In addition, superconducting circuit 150 may be coupled via capacitor 168 to receive an AC clock signal with a phase of 270 degrees. Although FIG. 1 shows a certain number of components of superconducting integrated circuit 100 arranged in a certain manner, there could be more or fewer number of components arranged differently. As an example, although FIG. 1 shows a schematic of a shift register circuit, superconducting integrated circuit 100 may be any other type of circuit, such as a logic gate, a flip-flop, or a memory circuit. In addition, although FIG. 1 shows a phase separation of 90 degrees and four clock lines, a phase separation of 120 degrees and three clock lines may also be used. Moreover, although FIG. 1 shows certain phase values associated with the clock lines, the clock lines need not receive clock signals with the phase value shown in FIG. 1. As an example, clock line 102 may receive an AC clock signal with a phase of 270 degrees, clock line 104 may receive an AC clock signal with a phase of 0 degrees, clock line 106 may receive an AC clock signal with a phase of 90 degrees, and clock line 108 may receive an AC clock signal with a phase of 180 degrees. Other phase allocations may also be used.

In terms of the operation of superconducting integrated circuit 100, each clock line may receive the respective AC clock signal and provide a respective bias current to a respective superconducting circuit. The AC clock signal with different phases coupled via different capacitors may propagate digital ones as a pair of single flux quantum (SFQ) pulses. In this example, the pulses are shown as loop currents that move through superconducting integrated circuit 100 with a half cycle of separation. The four-phase clock signals may provide directionality such that the positive pulse may ride the leading edge of the clock from one phase to the next and arrive at the output after one cycle of delay, and the negative pulse may follow with a half cycle of separation. In sum, in terms of the operation of superconducting integrated circuit 100, in this example, capacitive coupling supports bipolar pulses (e.g., SFQ pulses). The capacitors 152, 154, 156, and 158 are selected to have a smaller capacitance compared to the capacitance of a Josephson junction device so as not to load the superconducting circuit.

Figure 2:
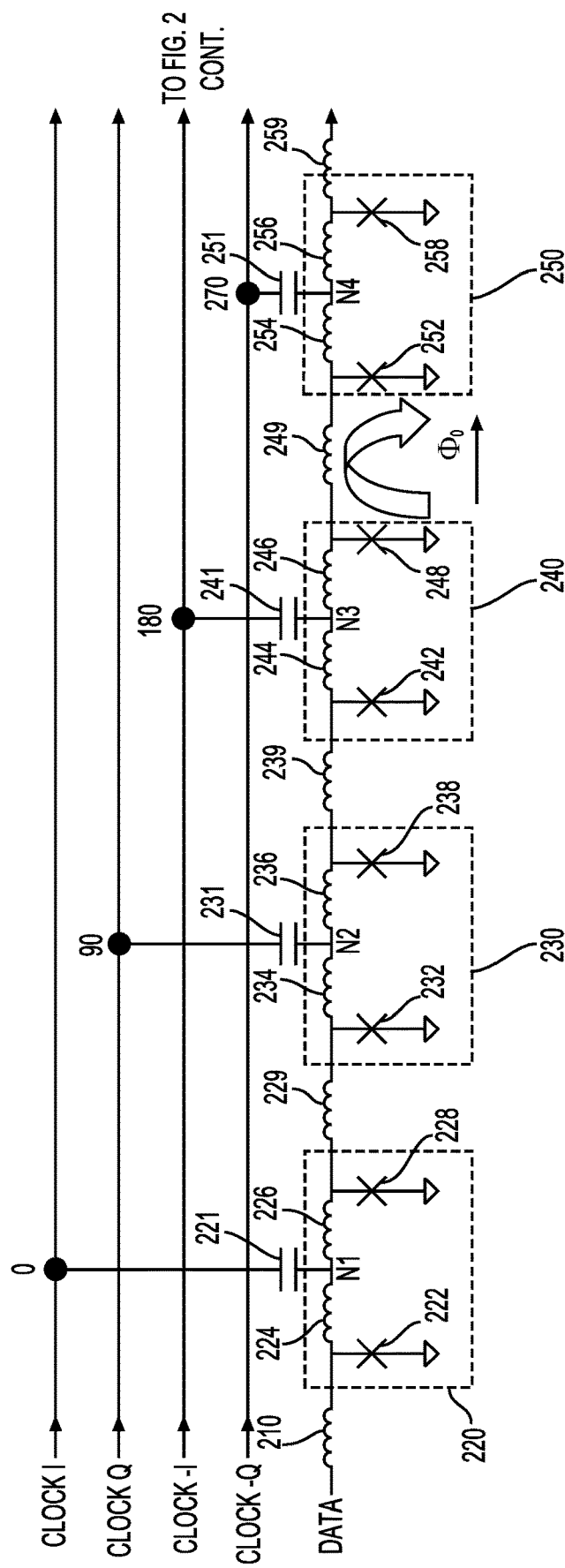
FIG. 2 is a diagram of another superconducting integrated circuit including circuits that are capacitively coupled to clock lines in accordance with one example.
Figure 2:
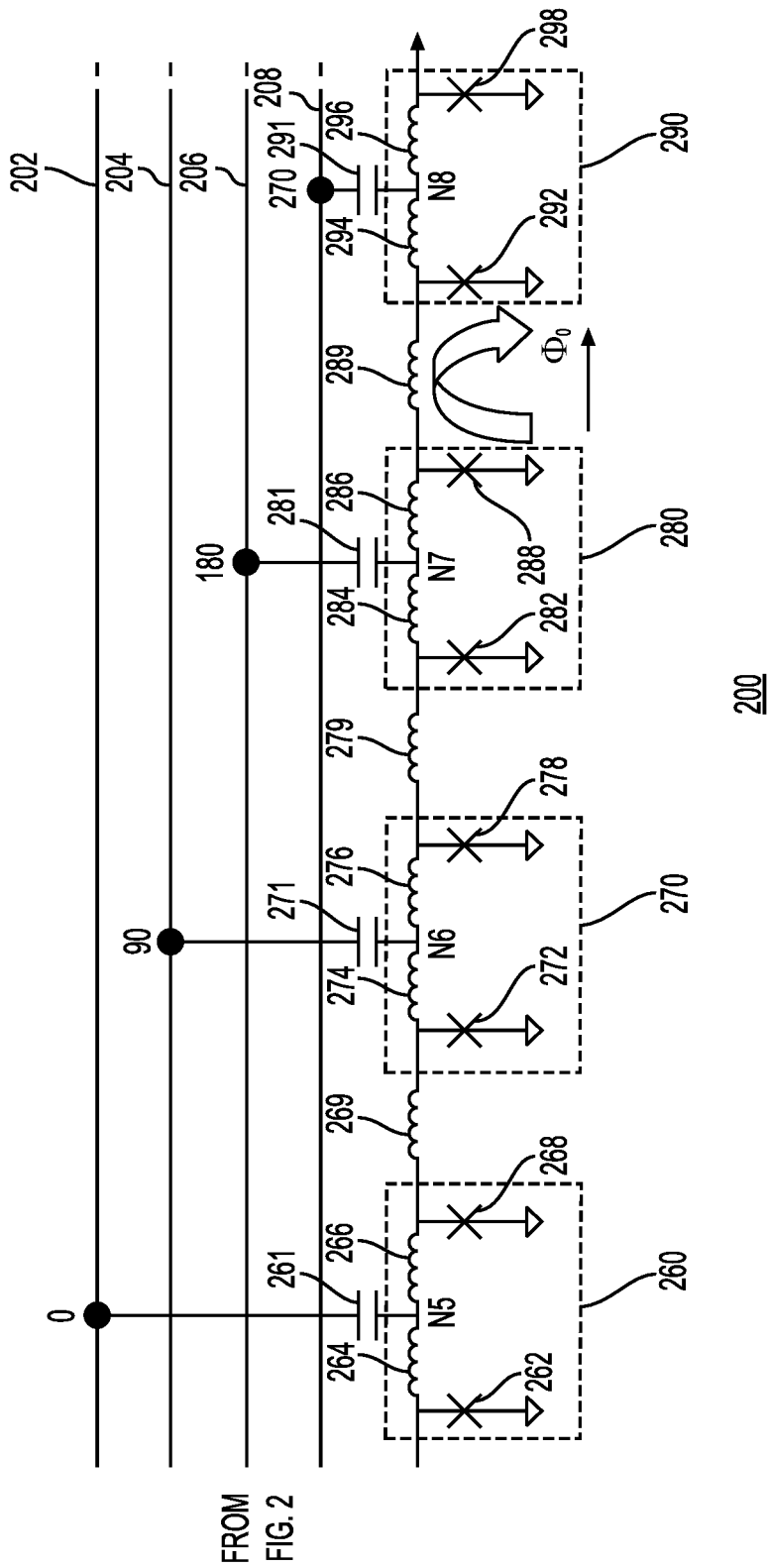

FIG. 2 is a diagram of another superconducting integrated circuit 200 including circuits that are capacitively coupled to clock lines in accordance with one example. Superconducting integrated circuit 200 may include superconducting circuit 220 coupled via capacitor 221 to clock line 202 coupled to the Clock I terminal. Superconducting integrated circuit 200 may further include superconducting circuit 230 coupled via capacitor 231 to clock line 204 coupled to the Clock Q terminal. Superconducting integrated circuit 200 may further include superconducting circuit 240 coupled via capacitor 241 to clock line 206 coupled to the Clock −I terminal. Superconducting integrated circuit 200 may further include superconducting circuit 250 coupled via capacitor 251 to clock line 208 coupled to the Clock −Q terminal. Superconducting integrated circuit 200 may include superconducting circuit 260 coupled via capacitor 261 to clock line 202. Superconducting integrated circuit 200 may further include superconducting circuit 270 coupled via capacitor 271 to clock line 204. Superconducting integrated circuit 200 may further include superconducting circuit 280 coupled via capacitor 281 to clock line 206. Superconducting integrated circuit 200 may further include superconducting circuit 290 coupled via capacitor 291 to clock line 208. Data input may be received via the DATA terminal that may be coupled to superconducting circuit 220 via an inductor 210.

Superconducting circuit 220 may include a Josephson junction (JJ) 222 coupled between one end of inductor 210 and a ground terminal. JJ 222 may further be coupled to inductor 224, which may be coupled to a node N1. The node N1 may be coupled to capacitor 221 and an inductor 226. Another JJ 228 may be coupled between one end of inductor 226 and the ground terminal. Superconducting circuit 220 may be coupled via inductor 229 to superconducting circuit 230. In addition, superconducting circuit 220 may be coupled via capacitor 221 to receive an AC clock signal with a phase of 0 degrees.

With continued reference to FIG. 2, superconducting circuit 230 may include a Josephson junction (JJ) 232 coupled between one end of inductor 229 and the ground terminal. JJ 232 may further be coupled to inductor 234, which may be coupled to a node N2. The node N2 may be coupled to capacitor 231 and an inductor 236. Another JJ 238 may be coupled between one end of inductor 236 and the ground terminal. Superconducting circuit 230 may be coupled via inductor 239 to superconducting circuit 240. In addition, superconducting circuit 230 may be coupled via capacitor 231 to receive an AC clock signal with a phase of 90 degrees.

Still referring to FIG. 2, superconducting circuit 240 may include a Josephson junction (JJ) 242 coupled between one end of inductor 239 and the ground terminal. JJ 242 may further be coupled to inductor 244, which may be coupled to a node N3. The node N3 may be coupled to capacitor 241 and an inductor 246. Another JJ 248 may be coupled between one end of inductor 246 and the ground terminal. Superconducting circuit 240 may be coupled via inductor 249 to superconducting circuit 250. In addition, superconducting circuit 240 may be coupled via capacitor 241 to receive an AC clock signal with a phase of 180 degrees.

With continued reference to FIG. 2, superconducting circuit 250 may include a Josephson junction (JJ) 252 coupled between one end of inductor 249 and the ground terminal. JJ 252 may further be coupled to inductor 254, which may be coupled to a node N4. The node N4 may be coupled to capacitor 251 and an inductor 256. Another JJ 258 may be coupled between one end of inductor 256 and the ground terminal. Superconducting circuit 250 may be coupled via inductor 259 to superconducting circuit 260. In addition, superconducting circuit 250 may be coupled via capacitor 251 to receive an AC clock signal with a phase of 270 degrees.

Superconducting circuit 260 may include a Josephson junction (JJ) 262 coupled between one end of inductor 259 and the ground terminal. JJ 262 may further be coupled to inductor 264, which may be coupled to a node N5. The node N5 may be coupled to capacitor 261 and an inductor 266. Another JJ 268 may be coupled between one end of inductor 226 and the ground terminal. Superconducting circuit 260 may be coupled via inductor 269 to superconducting circuit 270. In addition, superconducting circuit 260 may be coupled via capacitor 261 to receive an AC clock signal with a phase of 0 degrees.

With continued reference to FIG. 2, superconducting circuit 270 may include a Josephson junction (JJ) 272 coupled between one end of inductor 269 and the ground terminal. JJ 272 may further be coupled to inductor 274, which may be coupled to a node N6. The node N6 may be coupled to capacitor 271 and an inductor 276. Another JJ 278 may be coupled between one end of inductor 276 and the ground terminal. Superconducting circuit 270 may be coupled via inductor 279 to superconducting circuit 280. In addition, superconducting circuit 270 may be coupled via capacitor 271 to receive an AC clock signal with a phase of 90 degrees.

Still referring to FIG. 2, superconducting circuit 280 may include a Josephson junction (JJ) 282 coupled between one end of inductor 279 and the ground terminal. JJ 282 may further be coupled to inductor 284, which may be coupled to a node N7. The node N7 may be coupled to capacitor 281 and an inductor 286. Another JJ 288 may be coupled between one end of inductor 286 and the ground terminal. Superconducting circuit 280 may be coupled via inductor 289 to superconducting circuit 290. In addition, superconducting circuit 280 may be coupled via capacitor 281 to receive an AC clock signal with a phase of 180 degrees.

With continued reference to FIG. 2, superconducting circuit 290 may include a Josephson junction (JJ) 292 coupled between one end of inductor 289 and the ground terminal. JJ 292 may further be coupled to inductor 294, which may be coupled to a node N8. The node N8 may be coupled to capacitor 291 and an inductor 296. Another JJ 298 may be coupled between one end of inductor 296 and the ground terminal. In addition, superconducting circuit 290 may be coupled via capacitor 291 to receive an AC clock signal with a phase of 270 degrees. Although FIG. 2 shows a certain number of components of superconducting integrated circuit 200 arranged in a certain manner, there could be more or fewer number of components arranged differently. As an example, although FIG. 2 shows a schematic of a shift register circuit, superconducting integrated circuit 200 may be any other type of circuit, such as a logic gate, a flip-flop, or a memory circuit. In addition, although FIG. 2 shows a phase separation of 90 degrees between the clock signals and four clock lines, a phase separation of 120 degrees between the clock signals and three clock lines may also be used. Moreover, although FIG. 2 shows certain phase values associated with the clock lines, the clock lines need not receive clock signals with the phase value shown in FIG. 2. As an example, clock line 202 may receive an AC clock signal with a phase of 270 degrees, clock line 204 may receive an AC clock signal with a phase of 0 degrees, clock line 206 may receive an AC clock signal with a phase of 90 degrees, and clock line 208 may receive an AC clock signal with a phase of 180 degrees. Other phase allocations may also be used.

In terms of the operation of superconducting integrated circuit 200, each clock line may receive the respective AC clock signal and provide a respective bias current to a respective superconducting circuit. The AC clock signal with different phases coupled via different capacitors may propagate digital ones as a single flux quantum (SFQ) pulse. In this example, the pulses are shown as loop currents that move through superconducting integrated circuit 200 with one cycle of separation. The four-phase clock signals may provide directionality such that the positive pulses may ride the leading edge of the clock from one phase to the next and arrive at the output after one cycle of delay. In sum, in terms of the operation of superconducting integrated circuit 200, in this example, capacitive coupling supports unipolar pulses (e.g., only positive SFQ pulses). In circuits using inductive biasing, there is a need for time-interleaving of negative pulses with positive pulses, which serves to restore the bias current. Capacitive coupling has no such requirement, as the capacitor breaks the loop with respect to the bias supply. This means the capacitive coupling supports a superset of the data encodings supported by inductive coupling, including interleaved positive and negative pulses, one or multiple positive or negative clock pulses per cycle, or any combination thereof. The capacitors 221, 231, 241, 251, 261, 271, 281, and 291 are selected to have a smaller capacitance compared to the capacitance of a Josephson junction device so as not to load the superconducting circuit.

Figure 3:
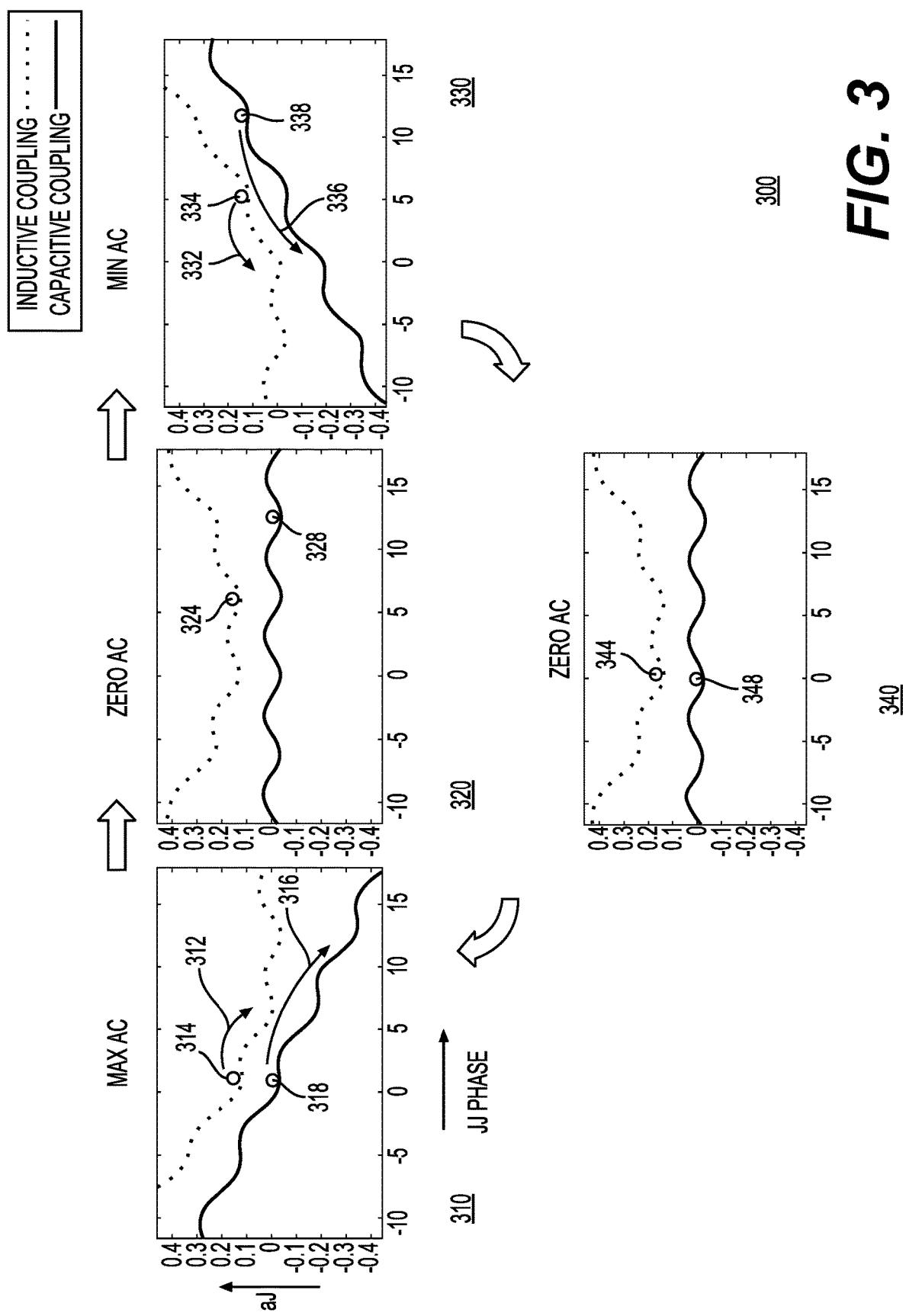
FIG. 3 is a diagram showing junction potentials under alternating-current (AC) bias for both capacitively coupled and inductively coupled superconducting circuits in accordance with one example.

FIG. 3 is a diagram showing graphs 300 of junction potentials under alternating-current (AC) bias for both capacitively coupled and inductively coupled superconducting circuits in accordance with one example. Graphs 300 show the Josephson junction potential at four points in the AC clock cycle for both inductively coupled AC clock power and capacitively coupled AC clock power. As shown in graphs 300, for inductive coupling each positive phase advance (if any) must be followed by a negative phase advance. In contrast, for capacitive coupling additional possibilities of phase advance exist. As an example, as shown in graphs 300, positive phase could advance by more than one. Each of graphs 310, 320, 330, and 340 shows Josephson junction (JJ) phase (shown in radians) along the horizontal axis and the energy stored in the JJ (shown in atto-Joules (aJ)) shown along the vertical axis. In this example, the energy difference between adjacent local minima may correspond to the amount of the energy that it takes for the Josephson junction to undergo a $2\pi$-radian phase rotation, producing an SFQ data pulse. The potential energy profile is a function of the Josephson junction and the bias current network. In graph 310, for inductive coupling, particle 314 shows the energy at a JJ phase when AC clock power is at its maximum value. For capacitive coupling, particle 318 shows the energy at the JJ phase when AC clock power is at its maximum value. As shown by curve 312, for the inductive coupling case, the phase advance is a single phase advance (e.g., $2\pi$ radian). However, for the capacitive coupling, as shown by curve 316, the phase advance is a double phase advance (e.g., 4π radian). As shown in graph 320, when the AC clock power is at zero value, there is no phase advance for both the capacitive coupling case (particle 328) and the inductive coupling case (particle 324). In graph 330, for inductive coupling, particle 334 shows the energy at a JJ phase when AC clock power is at its minimum value. For capacitive coupling, particle 338 shows the energy at the JJ phase when AC clock power is at its minimum value. As shown by curve 332, for the inductive coupling case, the phase advance is a single phase advance (e.g., 2π radian). However, for the capacitive coupling, as shown by curve 336, the phase advance is a double phase advance (e.g., 4π radian). As shown in graph 340, when the AC clock power is at zero value again, there is no phase advance for both the capacitive coupling case (particle 346) and the inductive coupling case (particle 344). Although FIG. 3 shows double phase advance for the capacitive coupling case, other possibilities exist. As an example, the phase may advance by a multiple of four (e.g., 8π radian). In addition, the junction potentials for capacitive coupling are larger, producing faster JJ switching. Moreover, because the junction potentials for capacitive coupling are periodic they allow for a wider range of data encodings.

Figure 4:
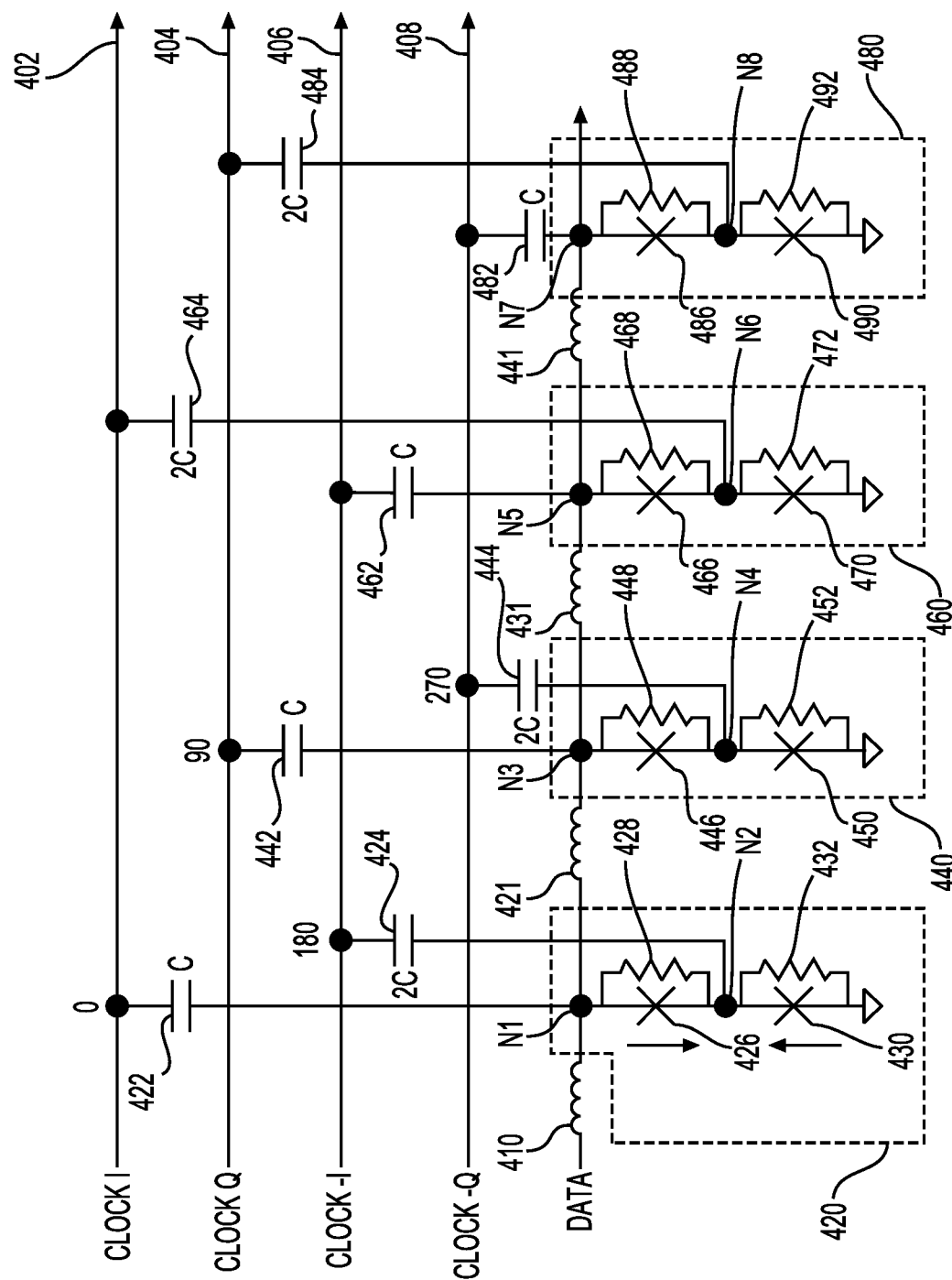
FIG. 4 is a diagram of another superconducting integrated circuit including circuits that are capacitively coupled to clock lines in accordance with one example.

FIG. 4 is a diagram of another superconducting integrated circuit 400 including circuits that are capacitively coupled to clock lines in accordance with one example. Superconducting integrated circuit 400 is configured to operate in phase-mode logic (PML) mode. In the PML based devices, a logical '1' may be encoded as a phase high and a logical '0' may be encoded as phase low. The transitions between phase high and phase low may be event-triggered by single flux quantum (SFQ) pulses. Unlike wave pipelined RQL mode where the waveform is returned to zero even when a logical value does not change, in the phase-mode logic circuits the waveform is not returned to zero until the logical value of the signal changes. Thus, if a signal has ten logical one values in succession the waveform would go high when the first logical high value is presented and stay high for the remaining logical high values. When superconducting integrated circuit 400 is configured in phase-mode logic, the latency of signal propagation is proportional to the transitions between positive and negative phase transitions. By enabling both positive and negative phase transitions at the same points in the clock cycle, capacitive coupling supports low-latency phase-mode logic circuits, such as superconducting integrated circuit 400. In contrast, the use of inductive coupling would not allow this and there will be at least half a clock cycle latency. Thus, capacitive coupling, including capacitive bias taps, enables low latency, greater efficiency, and smaller size circuits in phase-mode logic.

With continued reference to FIG. 4, superconducting integrated circuit 400 may include superconducting circuit 420 coupled via capacitor 422 to clock line 402 (coupled to the CLOCK I terminal) and further coupled via capacitor 424 to clock line 406 (coupled to the CLOCK −I terminal). As shown, in this example, clock line 402 may receive an AC clock signal with a phase of 0 degrees and clock line 406 may receive an AC clock signal with a phase of 180 degrees. Capacitor 424 may be configured to have twice the amount of capacitance (2C) relative to an amount of the capacitance (C) of capacitor 422. This is because the bias current produced by capacitor 424 may have an amplitude that is twice the amplitude of the bias current produced by capacitor 422. This in turn produces equal and opposite current through junctions 428 and 432. Superconducting integrated circuit 400 may further include superconducting circuit 440 coupled via capacitor 442 to clock line 404 (coupled to the CLOCK Q terminal) and further coupled via capacitor 444 to clock line 408 (coupled to the −Q terminal). As shown, in this example, clock line 404 may receive an AC clock signal with a phase of 90 degrees and clock line 408 may receive an AC clock signal with a phase of 270 degrees. Capacitor 444 may be configured to have twice the amount of capacitance (2C) relative to an amount of the capacitance (C) of capacitor 442. This is because the bias current produced by capacitor 444 may have an amplitude that is twice the amplitude of the bias current produced by capacitor 442. Superconducting integrated circuit 400 may further include superconducting circuit 460 coupled via capacitor 462 to clock line 406 and further coupled via capacitor 464 to clock line 402. As shown, in this example, clock line 402 may receive an AC clock signal with a phase of 0 degrees and clock line 406 may receive an AC clock signal with a phase of 180 degrees. Capacitor 464 may be configured to have twice the amount of capacitance (2C) relative to an amount of the capacitance (C) of capacitor 462. This is because the bias current produced by capacitor 464 may have an amplitude that is twice the amplitude of the bias current produced by capacitor 462. Superconducting integrated circuit 400 may further include superconducting circuit 480 coupled via capacitor 482 to clock line 404 and further coupled via capacitor 484 to clock line 408. As shown, in this example, clock line 404 may receive an AC clock signal with a phase of 90 degrees and clock line 408 may receive an AC clock signal with a phase of 270 degrees. Capacitor 484 may be configured to have twice the amount of capacitance (2C) relative to an amount of the capacitance (C) of capacitor 482. This is because the bias current produced by capacitor 484 may have an amplitude that is twice the amplitude of the bias current produced by capacitor 482. Data input may be received via the DATA terminal that may be coupled to superconducting circuit 420 via an inductor 410.

Superconducting integrated circuit 400 may further include superconducting circuit 440 coupled via capacitor 442 to clock line 404 (coupled to the CLOCK Q terminal) and further coupled via capacitor 444 to clock line 408 (coupled to the −Q terminal). As shown, in this example, clock line 404 may receive an AC clock signal with a phase of 90 degrees and clock line 408 may receive an AC clock signal with a phase of 270 degrees. Capacitor 444 may be configured to have twice the amount of capacitance (2C) relative to an amount of the capacitance (C) of capacitor 442. This is because the bias current produced by capacitor 444 may have an amplitude that is twice the amplitude of the bias current produced by capacitor 442. Superconducting integrated circuit 400 may further include superconducting circuit 460 coupled via capacitor 462 to clock line 406 and further coupled via capacitor 464 to clock line 402. As shown, in this example, clock line 402 may receive an AC clock signal with a phase of 0 degrees and clock line 406 may receive an AC clock signal with a phase of 180 degrees. Capacitor 464 may be configured to have twice the amount of capacitance (2C) relative to an amount of the capacitance (C) of capacitor 462. This is because the bias current produced by capacitor 464 may have an amplitude that is twice the amplitude of the bias current produced by capacitor 462. Superconducting integrated circuit 400 may further include superconducting circuit 480 coupled via capacitor 482 to clock line 404 and further coupled via capacitor 484 to clock line 408. As shown, in this example, clock line 404 may receive an AC clock signal with a phase of 90 degrees and clock line 408 may receive an AC clock signal with a phase of 270 degrees. Capacitor 484 may be configured to have twice the amount of capacitance (2C) relative to an amount of the capacitance (C) of capacitor 482. This is because the bias current produced by capacitor 484 may have an amplitude that is twice the amplitude of the bias current produced by capacitor 482. Data input may be received via the DATA terminal that may be coupled to superconducting circuit 420 via an inductor 410.

Still referring to FIG. 4, superconducting circuit 420 may include a node N1 coupled to receive an AC clock signal via clock line 402 and a node N2 coupled to receive an AC clock signal via clock line 406. Superconducting circuit 420 may further include a Josephson junction (JJ) 426 coupled between the node N1 and the node N2. A resistor 428 may also be coupled between the node N1 and the node N2. Another JJ 430 may be coupled between the node N2 and a ground terminal. A resistor 432 may also be coupled between the node N2 and the ground terminal. At about the same time during the clock cycle, JJ 426 may be positively biased (e.g., via the AC clock signal having a phase of 0 degrees, which is received via clock line 402), whereas JJ 430 may be negatively biased (e.g., via the AC clock signal having a phase of 180 degrees, which is received via clock line 406) resulting in a positive phase transition and a negative transition at about the same time during the clock cycle. Superconducting circuit 420 may be coupled via inductor 421 to superconducting circuit 440.

With continued reference to FIG. 4, superconducting circuit 440 may include a node N3 coupled to receive an AC clock signal via clock line 404 and a node N4 coupled to receive an AC clock signal via clock line 408. Superconducting circuit 440 may further include a Josephson junction (JJ) 446 coupled between the node N3 and the node N4. A resistor 448 may also be coupled between the node N3 and the node N4. Another JJ 450 may be coupled between the node N4 and the ground terminal. A resistor 452 may also be coupled between the node N4 and the ground terminal. At about the same time during the clock cycle, JJ 446 may be positively biased (e.g., via the AC clock signal having a phase of 90 degrees, which is received via clock line 404), whereas JJ 450 may be negatively biased (e.g., via the AC clock signal having a phase of 270 degrees, which is received via clock line 408) resulting in a positive phase transition and a negative transition at about the same time during the clock cycle. Superconducting circuit 440 may be coupled via inductor 431 to superconducting circuit 460.

As shown in FIG. 4, superconducting circuit 460 may include a node N5 coupled to receive an AC clock signal via clock line 406 and a node N6 coupled to receive an AC clock signal via clock line 402. Superconducting circuit 460 may further include a Josephson junction (JJ) 466 coupled between the node N5 and the node N6. A resistor 468 may also be coupled between the node N5 and the node N6. Another JJ 470 may be coupled between the node N6 and the ground terminal. A resistor 472 may also be coupled between the node N6 and the ground terminal. At about the same time during the clock cycle, JJ 466 may be negatively biased (e.g., via the AC clock signal having a phase of 180 degrees, which is received via clock line 406), whereas JJ 470 may be positively biased (e.g., via the AC clock signal having a phase of 0 degrees, which is received via clock line 402) resulting in a positive phase transition and a negative transition at about the same time during the clock cycle. Superconducting circuit 460 may be coupled via inductor 441 to superconducting circuit 480.

Still referring to FIG. 4, superconducting circuit 480 may include a node N7 coupled to receive an AC clock signal via clock line 408 and a node N8 coupled to receive an AC clock signal via clock line 404. Superconducting circuit 480 may further include a Josephson junction (JJ) 486 coupled between the node N7 and the node N8. A resistor 488 may also be coupled between the node N7 and the node N8. Another JJ 490 may be coupled between the node N8 and the ground terminal. A resistor 492 may also be coupled between the node N8 and the ground terminal. At about the same time during the clock cycle, JJ 486 may be negatively biased (e.g., via the AC clock signal having a phase of 270 degrees, which is received via clock line 408), whereas JJ 490 may be positively biased (e.g., via the AC clock signal having a phase of 90 degrees, which is received via clock line 404) resulting in a positive phase transition and a negative transition at about the same time during the clock cycle.

Although FIG. 4 shows a certain number of components of superconducting integrated circuit 400 arranged in a certain manner, there could be more or fewer number of components arranged differently. As an example, although FIG. 4 shows a schematic of a shift register circuit, superconducting integrated circuit 400 may be any other type of circuit, such as a logic gate, a flip-flop, or a memory circuit. In addition, although FIG. 4 shows a phase separation of 90 degrees between the clock signals and four clock lines, a phase separation of 120 degrees between the clock signals and three clock lines may also be used. Moreover, although FIG. 4 shows certain phase values associated with the clock lines, the clock lines need not receive clock signals with the phase value shown in FIG. 4. As an example, clock line 402 may receive an AC clock signal with a phase of 270 degrees, clock line 404 may receive an AC clock signal with a phase of 0 degrees, clock line 406 may receive an AC clock signal with a phase of 90 degrees, and clock line 408 may receive an AC clock signal with a phase of 180 degrees. Other phase allocations may also be used.

In terms of the operation of superconducting integrated circuit 400, the AC clock signals may once again provide bias current to Josephson junction. However, unlike the superconducting circuits described earlier that include Josephson junctions that are either biased positively or biased negatively, superconducting circuits 420, 440, 460, and 480 include Josephson junctions coupled in series such that one of the JJs can be biased positively while the other JJ can be biased negatively. Thus, superconducting integrated circuit 400 is configured such that both positive and negative transitions may occur at about the same point in the clock cycle. As explained earlier, in phase-mode logic the latency is proportional to the transitions between positive and negative phase transitions. By enabling both positive and negative phase transitions at the same points in the clock cycle, capacitive coupling supports low-latency phase-mode logic circuits, such as superconducting integrated circuit 400. In other words, the phase-mode logic circuits may operate without a phase boundary.

In addition, superconducting integrated circuits may be implemented using large scale integrated circuit manufacturing techniques using a process involving niobium metal layers to form the clock lines and the ground plane. Capacitors may be manufactured to have sufficient thickness to suppress Josephson junction tunnel current. In one example, capacitors may have aluminum-oxide as the insulator layer. In this example, capacitors may be manufactured to have a permittivity of approximately 8, a thickness of approximately 10 nm, a capacitance of approximately 7 femtoFarad (fF)/$\mu m^2$. The capacitors may be configured to support a voltage of 2 mV and should have a low loss tangent. To determine the amount of capacitance required for the capacitors for use with an integrated circuit the following equation may be used: $V2\pi fC=I_{JJ}$, where $I_{JJ}$ represents the Josephson junction current, V is the voltage across the capacitor, f is the frequency of the alternating current clock signal, and C is the capacitance of the capacitor. In this example, the impedance (Zc) seen by the clock signal may be represented by the equation: $Zc=1/\{2\pi fC\}$. Advantageously, capacitive coupling allows the use of high-frequency clock signals because the impedance seen by the clock signal is inversely proportional to the frequency of the clock signal. In addition, lower latency for phase-mode logic superconducting circuits can be achieved by increasing the frequency of the AC clock signals to some multiple of the required data rate. Capacitive coupling enables the higher frequency phase-mode logic circuits because unlike inductive coupling the frequency losses are frequency independent.

In conclusion, in one example, the present disclosure relates to a superconducting integrated circuit comprising a first clock line coupled via a first capacitor to a first superconducting circuit comprising a first Josephson junction, where the first capacitor is configured to receive a first clock signal having a first phase and couple a first bias current to the first superconducting circuit. The superconducting integrated circuit further comprises a second clock line coupled via a second capacitor to a second superconducting circuit comprising a second Josephson junction, where the second capacitor is configured to receive a second clock signal having a second phase and couple a second bias current to the second superconducting circuit, where the second phase is different from the first phase.

The superconducting integrated circuit may further include a third clock line coupled via a third capacitor to a third superconducting circuit comprising a third Josephson junction, where the third capacitor is configured to receive a third clock signal having a third phase and couple a third bias current to the third superconducting circuit, where the third phase is different from each of the first phase and the second phase. The superconducting integrated circuit may be configured such that a combined effect of the first bias current and the second bias current allows propagation of pulses via the first superconducting circuit and the second superconducting circuit in a first direction.

The first clock signal may comprise a first alternating current clock signal and where the second clock signal may comprise a second alternating current clock signal. The first alternating current clock signal may be configured to supply power to the first superconducting circuit via a first capacitive coupling between the first capacitor and the first alternating current clock signal and where the second alternating current clock signal may be configured to supply power to the second superconducting circuit via a second capacitive coupling between the second capacitor and the second alternating current clock signal.

Neither the first superconducting circuit nor the second superconducting circuit may be configured to receive power via inductive coupling. The first phase may comprise 0 degrees, the second phase may comprise 120 degrees, and the third phase may comprise 240 degrees.

In another aspect, the present disclosure relates to a superconducting integrated circuit comprising a first clock line coupled via a first capacitor to a first superconducting circuit comprising a first Josephson junction, where the first capacitor is configured to receive a first clock signal having a first phase and couple a first bias current to the first superconducting circuit. The superconducting integrated circuit further comprises a second clock line coupled via a second capacitor to a second superconducting circuit comprising a second Josephson junction, where the second capacitor is configured to receive a second clock signal having a second phase and couple a second bias current to the second superconducting circuit. The superconducting integrated circuit further comprises a third clock line coupled via a third capacitor to a third superconducting circuit comprising a third Josephson junction, where the third capacitor is configured to receive a third clock signal having a third phase and couple a third bias current to the third superconducting circuit. The superconducting integrated circuit further comprises a fourth clock line coupled via a fourth capacitor to a fourth superconducting circuit comprising a fourth Josephson junction, where the fourth capacitor is configured to receive a fourth clock signal having a fourth phase and couple a fourth bias current to the fourth superconducting circuit, where each of the first phase, the second phase, the third phase, and the fourth phase is different from each other.

The first clock signal may comprise a first alternating current clock signal, the second clock signal may comprise a second alternating current clock signal, the third clock signal may comprise a third alternating current clock signal, and the fourth clock signal comprises a fourth alternating current clock signal. The first alternating current clock signal may be configured to supply power to the first superconducting circuit via a first capacitive coupling between the first capacitor and the first alternating current clock signal, the second alternating current clock signal may be configured to supply power to the second superconducting circuit via a second capacitive coupling between the second capacitor and the second alternating current clock signal, the third alternating current clock signal may be configured to supply power to the third superconducting circuit via a third capacitive coupling between the third capacitor and the third alternating current clock signal, and the fourth alternating current clock signal may be configured to supply power to the fourth superconducting circuit via a fourth capacitive coupling between the fourth capacitor and the fourth alternating current clock signal.

None of the first superconducting circuit, the second superconducting circuit, the third superconducting circuit, or the fourth superconducting circuit may be configured to receive power via inductive coupling. The first phase may comprise 0 degrees, the second phase may comprise 90 degrees, the third phase may comprise 180 degrees, and the fourth phase may comprise 270 degrees.

The superconducting integrated circuit may be configured such that a combined effect of the first bias current, the second bias current, the third bias current, and the fourth bias current allows propagation of only positive single flux quantum (SFQ) pulses. Alternatively, the superconducting integrated circuit may be configured such that a combined effect of the first bias current, the second bias current, the third bias current, and the fourth bias current allows propagation of both positive single flux quantum (SFQ) pulses and negative SFQ pulses.

In yet another aspect, the present disclosure relates to a superconducting integrated circuit comprising a first superconducting circuit comprising a first Josephson junction coupled to a first node and a second Josephson junction coupled between the first node and a ground terminal. The superconducting integrated circuit further comprises a second superconducting circuit comprising a third Josephson junction coupled to a second node and a fourth Josephson junction coupled between the second node and the ground terminal. The superconducting integrated circuit further comprises a first clock line coupled via a first capacitor to the first Josephson junction, where the first capacitor is configured to receive a first clock signal having a first phase and couple a first bias current to the first Josephson junction. The superconducting integrated circuit further comprises a second clock line coupled via a second capacitor to the second Josephson junction, where the second capacitor is configured to receive a second clock signal having a second phase and couple a second bias current to the second Josephson junction. The superconducting integrated circuit further comprises a third clock line coupled via a third capacitor to third Josephson junction, where the third capacitor is configured to receive a third clock signal having a third phase and couple a third bias current to the third Josephson junction. The superconducting integrated circuit further comprises a fourth clock line coupled via a fourth capacitor to the fourth Josephson junction, where the fourth capacitor is configured to receive a fourth clock signal having a fourth phase and couple a fourth bias current to the fourth Josephson junction. The first clock signal may be configured to positively bias the first Josephson junction and the second clock signal may be configured to negatively bias the second Josephson junction at a first same point during a first clock cycle, and where the third clock signal may be configured to positively bias the third Josephson junction and the fourth clock signal may be configured to negatively bias the fourth Josephson junction at a second same point during a second clock cycle. The first clock signal may comprise a first alternating current clock signal, the second clock signal may comprise a second alternating current clock signal, the third clock signal may comprise a third alternating current clock signal, and the fourth clock signal may comprise a fourth alternating current clock signal.

None of the first superconducting circuit, the second superconducting circuit, the third superconducting circuit, or the fourth superconducting circuit may be configured to receive power via inductive coupling. The first phase may comprise 0 degrees, the second phase may comprise 90 degrees, the third phase may comprise 180 degrees, and the fourth phase may comprise 270 degrees.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting integrated circuit comprising:
   a first clock line coupled via a first capacitor to a first superconducting circuit comprising a first Josephson junction, wherein the first capacitor is configured to receive a first clock signal having a first phase and couple a first bias current to the first superconducting circuit; and
   a second clock line coupled via a second capacitor to a second superconducting circuit comprising a second Josephson junction, wherein the second capacitor is configured to receive a second clock signal having a second phase and couple a second bias current to the second superconducting circuit, wherein the second phase is different from the first phase.

2. The superconducting integrated circuit of claim 1 further comprising a third clock line coupled via a third capacitor to a third superconducting circuit comprising a third Josephson junction, wherein the third capacitor is configured to receive a third clock signal having a third phase and couple a third bias current to the third superconducting circuit, wherein the third phase is different from each of the first phase and the second phase.

3. The superconducting integrated circuit of claim 1, wherein the superconducting integrated circuit is configured such that a combined effect of the first bias current and the second bias current allows propagation of pulses via the first superconducting circuit and the second superconducting circuit in a first direction.

4. The superconducting integrated circuit of claim 1, wherein the first clock signal comprises a first alternating current clock signal and wherein the second clock signal comprises a second alternating current clock signal.

5. The superconducting integrated circuit of claim 4, wherein the first alternating current clock signal is configured to supply power to the first superconducting circuit via a first capacitive coupling between the first capacitor and the first alternating current clock signal and wherein the second alternating current clock signal is configured to supply power to the second superconducting circuit via a second capacitive coupling between the second capacitor and the second alternating current clock signal.

6. The superconducting integrated circuit of claim 5, wherein neither the first superconducting circuit nor the second superconducting circuit is configured to receive power via inductive coupling.

7. The superconducting integrated circuit of claim 2, wherein the first phase comprises 0 degrees, the second phase comprises 120 degrees, and the third phase comprises 240 degrees.

8. The superconducting integrated circuit of claim 3, wherein the superconducting integrated circuit is configured such that a combined effect of the first bias current and the second bias current allows propagation of the pulses via the first superconducting circuit and the second superconducting circuit in the first direction only.

9. A superconducting integrated circuit comprising:
a first clock line coupled via a first capacitor to a first superconducting circuit comprising a first Josephson junction, wherein the first capacitor is configured to receive a first clock signal having a first phase and couple a first bias current to the first superconducting circuit;
a second clock line coupled via a second capacitor to a second superconducting circuit comprising a second Josephson junction,
wherein the second capacitor is configured to receive a second clock signal having a second phase and couple a second bias current to the second superconducting circuit;
a third clock line coupled via a third capacitor to a third superconducting circuit comprising a third Josephson junction, wherein the third capacitor is configured to receive a third clock signal having a third phase and couple a third bias current to the third superconducting circuit; and
a fourth clock line coupled via a fourth capacitor to a fourth superconducting circuit comprising a fourth Josephson junction, wherein the fourth capacitor is configured to receive a fourth clock signal having a fourth phase and couple a fourth bias current to the fourth superconducting circuit, wherein each of the first phase, the second phase, the third phase, and the fourth phase is different from each other.

10. The superconducting integrated circuit of claim 9, wherein the first clock signal comprises a first alternating current clock signal, the second clock signal comprises a second alternating current clock signal, the third clock signal comprises a third alternating current clock signal, and the fourth clock signal comprises a fourth alternating current clock signal.

11. The superconducting integrated circuit of claim 10, wherein the first alternating current clock signal is configured to supply power to the first superconducting circuit via a first capacitive coupling between the first capacitor and the first alternating current clock signal, the second alternating current clock signal is configured to supply power to the second superconducting circuit via a second capacitive coupling between the second capacitor and the second alternating current clock signal, the third alternating current clock signal is configured to supply power to the third superconducting circuit via a third capacitive coupling between the third capacitor and the third alternating current clock signal, and the fourth alternating current clock signal is configured to supply power to the fourth superconducting circuit via a fourth capacitive coupling between the fourth capacitor and the fourth alternating current clock signal.

12. The superconducting integrated circuit of claim 11, wherein none of the first superconducting circuit, the second superconducting circuit, the third superconducting circuit, or the fourth superconducting circuit is configured to receive power via inductive coupling.

13. The superconducting integrated circuit of claim 11, wherein the first phase comprises 0 degrees, the second phase comprises 90 degrees, the third phase comprises 180 degrees, and the fourth phase comprises 270 degrees.

14. The superconducting integrated circuit of claim 10, wherein the superconducting integrated circuit is configured such that a combined effect of the first bias current, the second bias current, the third bias current, and the fourth bias current allows propagation of only positive single flux quantum (SFQ) pulses.

15. The superconducting integrated circuit of claim 10, wherein the superconducting integrated circuit is configured such that a combined effect of the first bias current, the second bias current, the third bias current, and the fourth bias current allows propagation of both positive single flux quantum (SFQ) pulses and negative SFQ pulses.

16. A superconducting integrated circuit comprising:
a first superconducting circuit comprising a first Josephson junction coupled to a first node and a second Josephson junction coupled between the first node and a ground terminal;
a second superconducting circuit comprising a third Josephson junction coupled to a second node and a fourth Josephson junction coupled between the second node and the ground terminal;
a first clock line coupled via a first capacitor to the first Josephson junction, wherein the first capacitor is configured to receive a first clock signal having a first phase and couple a first bias current to the first Josephson junction;
a second clock line coupled via a second capacitor to the second Josephson junction, wherein the second capacitor is configured to receive a second clock signal having a second phase and couple a second bias current to the second Josephson junction;
a third clock line coupled via a third capacitor to third Josephson junction, wherein the third capacitor is configured to receive a third clock signal having a third phase and couple a third bias current to the third Josephson junction; and
a fourth clock line coupled via a fourth capacitor to the fourth Josephson junction, wherein the fourth capacitor is configured to receive a fourth clock signal having a fourth phase and couple a fourth bias current to the fourth Josephson junction.

17. The superconducting integrated circuit of claim 16, wherein the first clock signal is configured to positively bias the first Josephson junction and the second clock signal is configured to negatively bias the second Josephson junction at a first same point during a first clock cycle, and wherein the third clock signal is configured to positively bias the third Josephson junction and the fourth clock signal is configured to negatively bias the fourth Josephson junction at a second same point during a second clock cycle.

18. The superconducting integrated circuit of claim 17, wherein the first clock signal comprises a first alternating current clock signal, the second clock signal comprises a second alternating current clock signal, the third clock signal comprises a third alternating current clock signal, and the fourth clock signal comprises a fourth alternating current clock signal.

19. The superconducting integrated circuit of claim 18, wherein none of the first superconducting circuit, the second superconducting circuit, the third superconducting circuit, or the fourth superconducting circuit is configured to receive power via inductive coupling.

20. The superconducting integrated circuit of claim 16, wherein the first phase comprises 0 degrees, the second phase comprises 180 degrees, the third phase comprises 90 degrees, and the fourth phase comprises 270 degrees.

\* \* \* \* \*